(12) United States Patent
Roohparvar

(10) Patent No.: US 7,046,536 B2
(45) Date of Patent: May 16, 2006

(54) PROGRAMABLE IDENTIFICATION CIRCUITRY

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 393 days.

(21) Appl. No.: 10/159,140

(22) Filed: May 29, 2002

(65) Prior Publication Data

US 2003/0223281 A1    Dec. 4, 2003

(51) Int. Cl.
    *G11C 27/00*    (2006.01)
(52) U.S. Cl. ...................................................... 365/45
(58) Field of Classification Search .................. 365/45, 365/225.7, 189.12
    See application file for complete search history.

(56) References Cited

U.S. PATENT DOCUMENTS

| | | | |
|---|---|---|---|
| 5,010,331 A * | 4/1991 | Dias et al. ................... 365/96 |
| 5,365,045 A * | 11/1994 | Iijima ......................... 235/380 |
| 5,592,632 A * | 1/1997 | Leung et al. ........ 257/E21.526 |
| 5,642,307 A | 6/1997 | Jernigan | |
| 5,666,411 A | 9/1997 | McCarty | |
| 5,856,923 A | 1/1999 | Jones | |
| 5,927,512 A | 7/1999 | Beffa | |
| 5,984,190 A * | 11/1999 | Nevill ......................... 235/492 |
| 5,990,826 A * | 11/1999 | Mitchell ................. 342/357.06 |
| 6,446,017 B1 | 9/2002 | Skidmore | |
| 6,459,635 B1 | 10/2002 | Mullarkey | |
| 6,487,474 B1 * | 11/2002 | Goodman et al. .......... 711/111 |
| 6,516,366 B1 * | 2/2003 | Gates et al. ................ 710/105 |
| 6,601,086 B1 * | 7/2003 | Howard et al. ............. 709/203 |
| 6,810,435 B1 * | 10/2004 | Palmer et al. .................. 710/8 |

* cited by examiner

*Primary Examiner*—Thong Q. Le
(74) *Attorney, Agent, or Firm*—Leffert Jay & Polglaze, P.A.

(57) ABSTRACT

An integrated circuit has been described that includes a user programmable identification code register. The register can be programmed by the user to emulate other integrated circuit devices. The integrated circuit register can also be reset to reflect the original manufacturer information. The integrated circuit can be a memory device and allows the user to upgrade a system while indicating to the original system that the device is compatible.

15 Claims, 2 Drawing Sheets

PROGRAMABLE IDENTIFICATION CIRCUITRY

FIELD OF THE INVENTION

The present invention relates generally to integrated circuits and in particular the present invention relates to identification code circuitry of integrated circuits.

BACKGROUND OF THE INVENTION

Most electronic devices have an electronic identifier code associated them. The codes typically consist of two or more fields. The first field is the Manufacturer's ID that identifies the company that makes the product. The second one refers to the family of products that the device belongs to. These codes are permanently stored in the device and can be read by an external device via an identification query.

System programmers use the identification codes to adjust the system to the device. For example, system programmers use the codes to determine algorithms required to write patterns to non-volatile memory devices. In some systems, these codes are used to determine the memory block sizes, the voltage ranges, etc. that are necessary to communicate with these devices.

The first manufacturer that produces a device often collaborates with software developers to use their ID codes. That is, the system is programmed to look for a specific ID before the system will support a device. As such, a second manufacturer who develops a compatible product cannot implement the new product in existing systems. This is due to the incompatibility of the ID codes.

Further if the system manufacturer decides to support another device in their system instead of the original device, the software query code that was loaded on the system must be changed to be able to use the new manufacturer. This is sometimes very difficult since the product may be out of the development cycle and would make it more difficult for end users of such devices to change manufacturers, even though the new devices may have advantages in the area of cost or reliability.

For the reasons stated above, and for other reasons stated below which will become apparent to those skilled in the art upon reading and understanding the present specification, there is a need in the art for integrated circuits that can be used in a system designed for prior integrated circuits.

SUMMARY OF THE INVENTION

The above-mentioned problems with integrated circuit identification and other problems are addressed by the present invention and will be understood by reading and studying the following specification.

In one embodiment, an integrated circuit device comprises a programmable identification register to store identification data, and a control circuit coupled to program the identification register in response to an externally provided command.

In another embodiment, a memory device comprises a programmable identification register to store identification data, control signal inputs, and a control circuit coupled to program the identification register in response to a command provided on the control signal inputs.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

As explained above, integrated circuits often include an identification code that can be read when the device is installed in a system. The identification code usually includes one field to indicating a manufacturer. The identification code can also include a second field that indicates the device, and or a family of devices. These codes are used by a system designer to identify a communication algorithm and/or operational specifications used by the device. For example, in a memory device the codes may be used to identify the memory size and voltage levels used by the memory.

As improvements are made in integrated circuit generations, reverse compatibility is often considered. That is, new circuits are designed to substantially communicate with prior systems. A problem is encountered when a prior system looks for specific identifications codes of prior devices. Although new devices may provide cost and/or performance benefits, the identification codes of the new device are not recognized by the system. One option that could be used is to change the identification code the system is looking for. That is, the original codes could be updated to match the new device. This option is often not practical because the system is no longer supported by those skilled to make the necessary changes.

Embodiments of the present invention allow new devices to be backward compatible in existing systems by allowing the user to change the manufacture and device identification codes to emulate the prior device codes. As such, the identification codes can be changed when the new device is installed in the system. One embodiment of the present invention is a memory device, such as a volatile or non-volatile flash memory (DRAM, SDRAM, FLASH, SRAM, ect). Prior to describing the identification code modification in more detail, a description of a non-volatile memory device of an embodiment of the present invention is provided.

Figure 1:
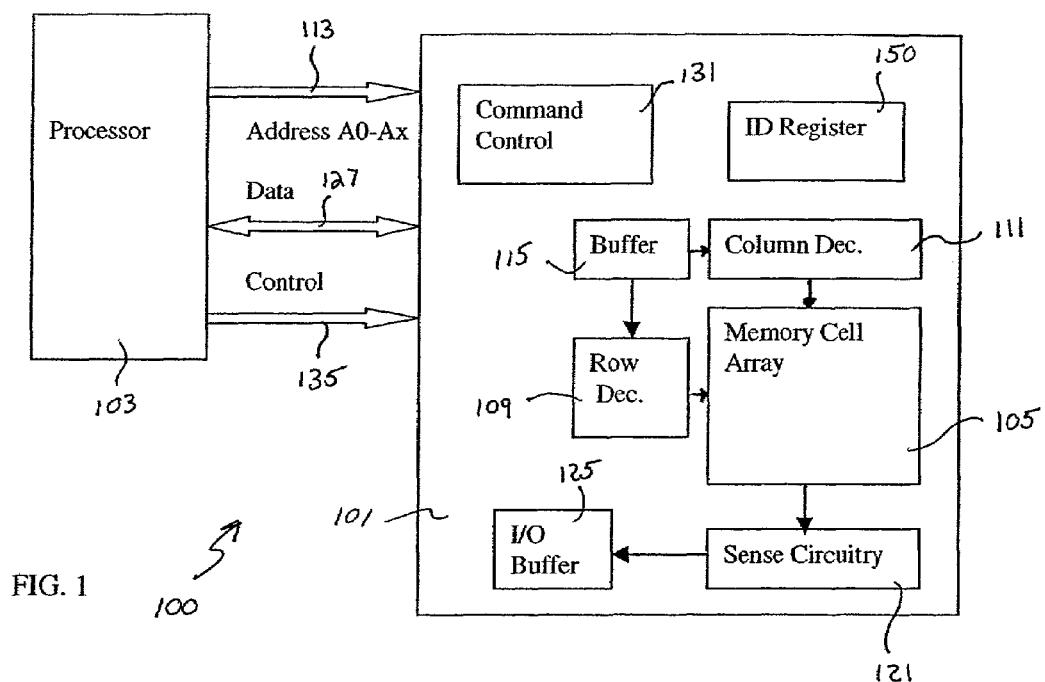
FIG. 1 is a block diagram of a memory device of an embodiment of the present invention.

FIG. 1 is a functional block diagram of a flash memory device 101, of one embodiment of the present invention, that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

An address buffer circuit 115 is provided to latch address signals provided on address lines A0–Ax 113. Address signals are received and decoded by row decoder 109 and a column decoder 111 to access the memory array 105. Sensing circuitry 121 is used to sense and amplify data stored in the memory cells. Data input and output buffer circuitry 125 is included for bi-directional data communication over a plurality of data (DQ) connections 127 with the processor 103. Command control circuit 131 decodes signals provided on control inputs 135 from the processor 103. These signals are used to control the operations on the memory array 105, including data read, data write, and erase operations.

An identification register 150 is provided to store the identification code of the memory. The register is a non-volatile register that is initially programmed when the memory is manufactured. In response to an external inquiry, the memory device outputs the contents of the register. As explained below, the register can be re-programmed by the user using the control inputs and the DQ connections.

The flash memory device 101 has been simplified to facilitate a basic understanding of the features of the memory. A more detailed understanding of the internal circuitry of flash memories is known to those skilled in the art.

Figure 2:
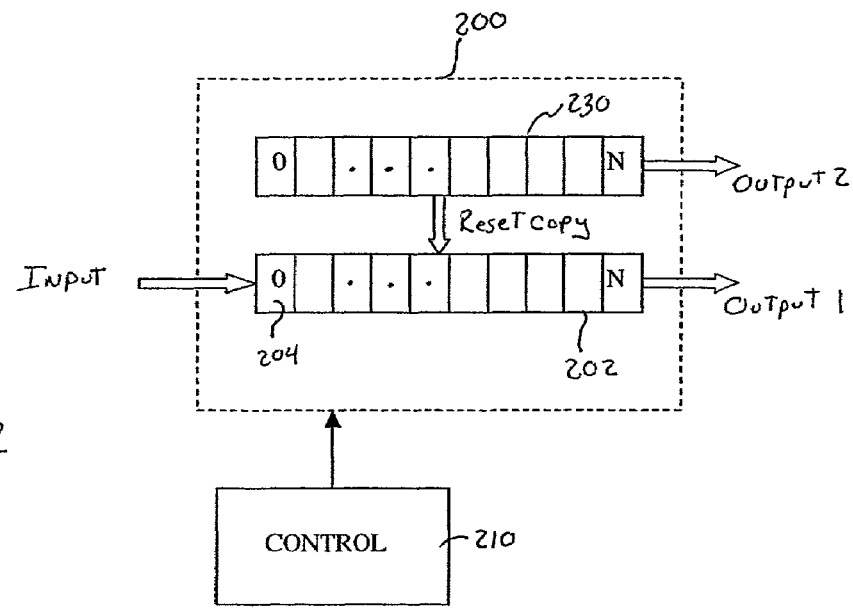
FIG. 2 illustrates identification register circuitry of an embodiment of the present invention.

Referring to FIG. 2, an identification register circuit 200 is described in greater detail. The register includes a first register 202 having a plurality of bits 204 (0 to N) to identify the manufacturer and the device. The present invention is not limited to the contents of the register. That is, the register may contain more or less information. The register is non-volatile and programmable by control circuitry 210 provided in the device. In a memory device, the command and control circuitry 131 of the memory can program the register in response to an external command(s). An external processor 103, or controller, issues a program command to change the contents of the register. The new contents (Input) of the register can be provided on either the data connections 127 or the address lines 113. When the device identification is queried, the contents of register 202 are output from the device (Output 1).

A second optional register 230 can be included to retain the original identification code. This register can be non-volatile memory cells or hard wired into the device, such as a fuse circuit. By retaining the original manufacturer identification codes, the present invention allows the user to reset the codes and copy the contents of register 230 into register 200. In addition, a special query can be provided in one embodiment to allow the original codes to be read without resetting the programmable register (Output 2).

Figure 3:
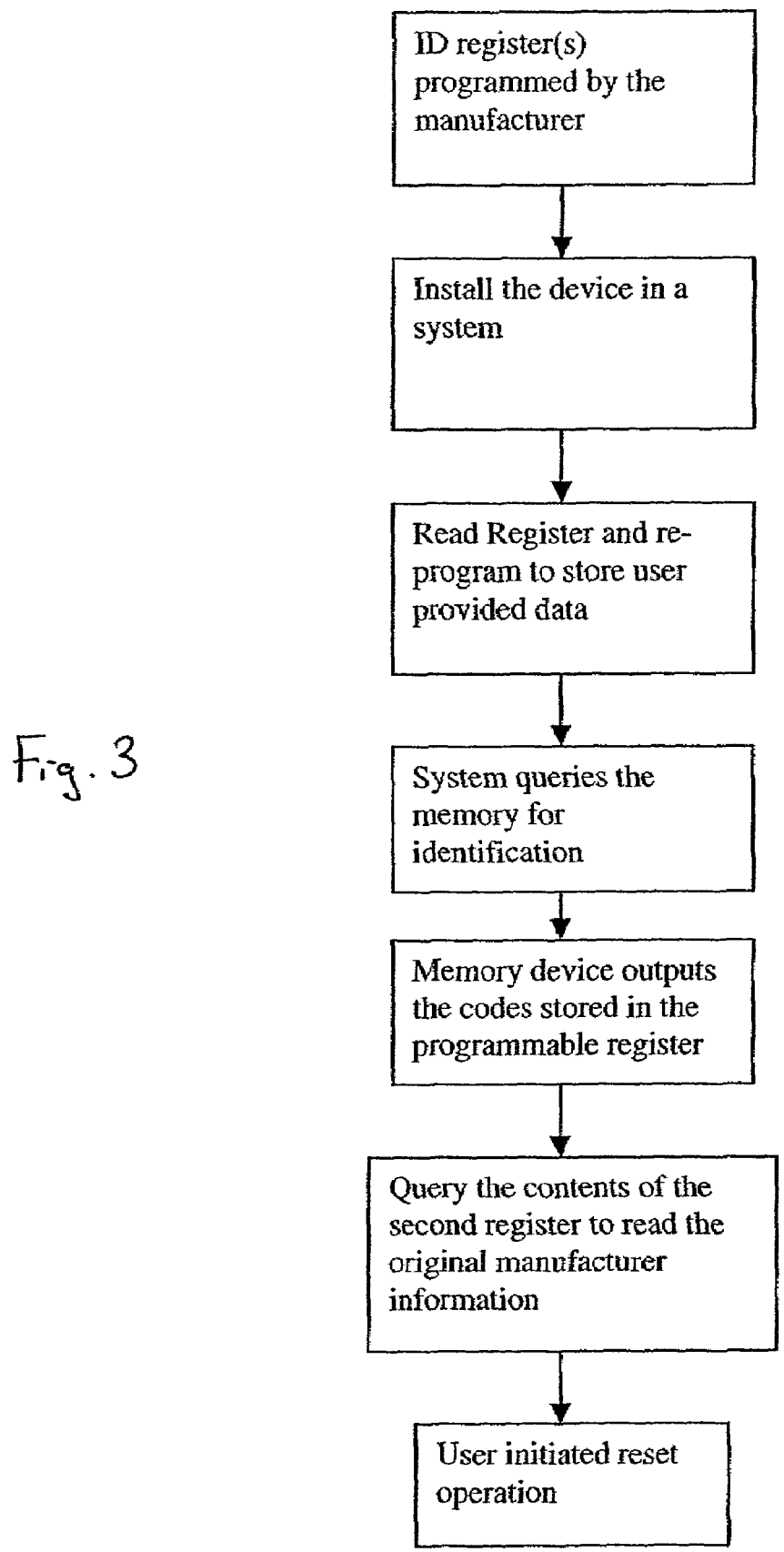
FIG. 3 is a flow chart illustrating optional operations of the circuitry of FIG. 2.

FIG. 3 illustrates a flow chart of possible implementations of a memory device of the present invention. During fabrication, the identification registers are programmed by the manufacturer. The user then installs the device in a system. The identification register can be read and re-programmed to store user provided data. During operation, the system queries the memory for identification and the memory device outputs the codes stored in the programmable regis-ter. The user can query the contents of the second register to read the original manufacturer information. The user can initiate a reset operation to load the programmable register with the contents of the second register.

CONCLUSION

An integrated circuit has been described that includes a user programmable identification code register. The register can be programmed by the user to emulate other integrated circuit devices. The integrated circuit register can also be reset to reflect the original manufacturer information. The integrated circuit can be a memory device and allows the user to upgrade a system while indicating to the original system that the device is compatible.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. An integrated circuit device comprising:
a programmable identification register to store identification data; and
a control circuit coupled to program the identification register in response to an externally provided command; wherein the identification register comprises:
a first register to store original manufacturer data; and
a second register to store user provided data in response to the externally provided command.

2. The integrated circuit device of claim 1 wherein the control circuit copies data from the first register to the second register in response to an externally provided reset command.

3. The integrated circuit device of claim 1 wherein the first register comprises memory cells.

4. The integrated circuit device of claim 1 wherein the first register is fuse circuit.

5. The integrated circuit device of claim 1 wherein the integrated circuit device is a memory device.

6. A memory device comprising:
a programmable identification register to store identification data;
control signal inputs: and
a control circuit coupled to program the identification register in response to a command provided on the control signal inputs;
wherein the identification register comprises first and second registers to store original manufacturer data, wherein the second register is programmable to store user provided data in response to the externally provided command.

7. The memory device of claim 6 wherein the memory device is a non-volatile memory.

8. The memory device of claim 6 wherein the identification data comprises a manufacturer code and a device identification code.

9. A method of operating an integrated circuit comprising:
reading identification codes stored in a register of the integrated circuit wherein the register comprises a first user programmable register and a manufacturer programmed register; and reprogramming the first user programmable register in response to external commands to change the identification codes to user provided codes.

10. The method of claim 9 further comprises resetting the register to store original manufacturer data using externally provided commands.

11. The method of claim 9 wherein the identification codes comprise a manufacturer identification code and a device identification code.

12. A method of operating an integrated circuit comprising:
   programming first and second registers of the integrated circuit with manufacturer provided identification codes;
   installing the integrated circuit in a system comprising a controller; and
   reprogramming the second register in response to external commands from the controller to store user provided codes.

13. The method of claim 12 further comprises resetting the second register to copy the manufacturer provided identification codes from the first register into the second register.

14. The method of claim 12 wherein the user provided codes comprise codes identifying a second manufacturer and device, such that the integrated circuit emulates a second integrated circuit device.

15. The method of claim 12 further comprises reading contents of the first and second registers in response to queries by the controller.

* * * * *